(12) United States Patent
Lim et al.

(10) Patent No.: US 9,762,206 B2
(45) Date of Patent: Sep. 12, 2017

(54) AT-CUT QUARTZ CRYSTAL VIBRATOR WITH A LONG SIDE ALONG THE X-AXIS DIRECTION

(71) Applicant: SAMSUNG ELECTRO-MECHANICS CO., LTD., Gyeonggi-Do (KR)

(72) Inventors: Seung Mo Lim, Gyeonggi-Do (KR); Ho Phil Jung, Gyeonggi-Do (KR); In Young Kang, Gyeonggi-Do (KR); Je Hong Kyoung, Gyeonggi-Do (KR); Sung Wook Kim, Gyeonggi-Do (KR); Jong Pil Lee, Gyeonggi-Do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 365 days.

(21) Appl. No.: 14/616,232

(22) Filed: Feb. 6, 2015

(65) Prior Publication Data

US 2015/0229291 A1 Aug. 13, 2015

(30) Foreign Application Priority Data

Feb. 7, 2014 (KR) .................. 10-2014-0014350
May 29, 2014 (KR) .................. 10-2014-0065315

(51) Int. Cl.
*H03H 9/19* (2006.01)

(52) U.S. Cl.
CPC .................................... *H03H 9/19* (2013.01)

(58) Field of Classification Search
CPC ..................................................... H03H 9/19
USPC ................................................... 310/360–361
See application file for complete search history.

(56) References Cited

U.S. PATENT DOCUMENTS

| | | | | |
|---|---|---|---|---|
| 4,148,530 A | * | 4/1979 | Calderara | G01L 1/16 310/361 |
| 8,581,476 B2 | | 11/2013 | Amano et al. | |
| 2004/0095044 A1 | * | 5/2004 | Yagishita | H03H 9/19 310/348 |
| 2007/0001555 A1 | * | 1/2007 | Tanaka | H03H 9/0547 310/361 |
| 2009/0102326 A1 | * | 4/2009 | Chiba | H03H 9/02023 310/367 |
| 2011/0095657 A1 | * | 4/2011 | Yamashita | H03H 9/1021 310/367 |
| 2011/0316390 A1 | * | 12/2011 | Umeki | H03H 9/1021 310/344 |
| 2012/0049695 A1 | * | 3/2012 | Ichikawa | H03H 3/02 310/344 |
| 2014/0292434 A1 | * | 10/2014 | Kikushima | H03H 9/172 331/158 |
| 2014/0361842 A1 | * | 12/2014 | Chen | H03B 5/36 331/44 |
| 2015/0180446 A1 | * | 6/2015 | Yamada | H03H 9/19 310/360 |

(Continued)

FOREIGN PATENT DOCUMENTS

JP        2011193292 A  *  9/2011

*Primary Examiner* — J. San Martin
(74) *Attorney, Agent, or Firm* — NSIP Law

(57) ABSTRACT

Embodiments of the invention provide a quartz crystal vibrator including an AT-cut quartz crystal piece having a long side in an X axis direction and including first and second crystal planes formed on at least one side surface thereof in a Y' axis direction, and an electrode layer formed on the AT-cut quartz crystal piece.

13 Claims, 11 Drawing Sheets

(56) References Cited

U.S. PATENT DOCUMENTS

| | | | |
|---|---|---|---|
| 2015/0303896 A1* | 10/2015 | Lim | H03H 9/19 |
| | | | 310/361 |
| 2016/0241188 A1* | 8/2016 | Komine | H03B 5/32 |
| 2016/0277004 A1* | 9/2016 | Kobayashi | H03H 9/17 |
| 2016/0294356 A1* | 10/2016 | Kuwahara | H03H 9/19 |
| 2017/0070206 A1* | 3/2017 | Sato | H03H 3/02 |
| 2017/0070207 A1* | 3/2017 | Shimao | H03H 9/132 |
| 2017/0070208 A1* | 3/2017 | Lee | H03H 9/19 |
| 2017/0104473 A1* | 4/2017 | Fukuzawa | H03H 9/19 |

\* cited by examiner

AT-CUT QUARTZ CRYSTAL VIBRATOR WITH A LONG SIDE ALONG THE X-AXIS DIRECTION

CROSS REFERENCE TO RELATED APPLICATION

This application claims the benefit of and priority under 35 U.S.C. §119 to Korean Patent Application No. KR 10-2014-0065315, entitled, "QUARTZ CRYSTAL VIBRATOR AND MANUFACTURING METHOD THEREOF," filed on May 29, 2014, and Korean Patent Application No. KR 10-2014-0014350, entitled, "QUARTZ CRYSTAL VIBRATOR AND MANUFACTURING METHOD THEREOF," filed on Feb. 7, 2014, which are hereby incorporated by reference in their entirety into this application.

BACKGROUND

Field of the Invention

The present invention relates to a quartz crystal vibrator and a manufacturing method thereof.

Description of the Related Art

In general, a vibration piece using quartz crystal may obtain a high frequency and has stable frequency characteristics, such that the vibration piece has been used in reference frequency sources, oscillation sources, for example, of various electronic devices. To this end, a quartz crystal piece is made of quartz gemstone in a direction suitable for characteristics, and this quartz crystal piece is used as a vibrator, as a non-limiting example.

Among them, an AT-cut quartz crystal substrate is cut so that a surface thereof obtained by rotating a plane including X and Y axes of a quartz crystal along a circumference of the X axis at an angle of about 35° 15' in a counterclockwise direction from the X axis becomes a main surface, and the vibration piece using the AT-cut quartz crystal substrate has been widely used in a mobile communications terminal, for example, due to excellent frequency-temperature characteristics.

However, in an AT-cut quartz crystal substrate according to the convention art, as described, for example, in U.S. Pat. No. 8,581,476, at the time of processing a side surface, a wet etching method has been used, but a sequence of an expressed plane is changed depending on the kind of etching solution and a temperature, an etched surface is not vertical to a flat main surface but has an obliquely inclined shape, and various planes are expressed, such that it is impossible to implement a precise element.

SUMMARY

Accordingly, embodiments of the invention have been made to provide a quartz crystal vibrator capable of accurately designing a chip by processing a side surface using a position deviation of a mask at the time of processing a side surface of an AT-cut quartz crystal piece to prevent formation of an irregular multi-surface at the side surface and capable of increasing an energy trap effect due to a stable structure and having a low equivalent serial resistance (ESR) and a stable natural frequency, and a manufacturing method thereof.

According to at least one embodiment of the invention, there is provided a quartz crystal vibrator, which includes an AT-cut quartz crystal piece having a long side in an X axis direction and including first and second crystal planes formed on at least one side surface thereof in a Y' axis direction, and an electrode layer formed on the AT-cut quartz crystal piece.

According to at least one embodiment, the first and second crystal planes are formed on one side surface and the other side surface of the AT-cut quartz crystal piece in the Y' axis direction, respectively.

According to at least one embodiment, the first crystal plane of the AT-cut quartz crystal piece is formed of an inclined surface.

According to at least one embodiment, the first crystal plane is formed of an m-plane.

According to at least one embodiment, the second crystal plane of the AT-cut quartz crystal piece is formed of an r-plane.

According to at least one embodiment, the AT-cut quartz crystal piece has a short side in the Y' axis direction and a thickness in a Z' axis direction.

According to at least one embodiment, the first and second masks are formed on one surface and the other surface of the AT-cut quartz crystal piece in a Z' axis direction, respectively, to have a position deviation of ΔM therebetween in the Y' axis direction, and the AT-cut quartz crystal piece is etched with respect to the first and second masks, such that the first and second crystal planes are formed on at least one side surface of the AT-cut quartz crystal piece in the Y' axis direction.

According to at least one embodiment, a protrusion part is formed on both surfaces of the AT-cut quartz crystal piece in a Z' axis direction, and the electrode layer is formed on each of the protrusion parts.

According to at least one embodiment of the invention, there is provided a quartz crystal vibrator, which includes an AT-cut quartz crystal piece having a long side in an X axis direction and comprising a first crystal plane formed on at least one side surface thereof in a Y' axis direction, and an electrode layer formed on the AT-cut quartz crystal piece.

According to at least one embodiment, the first crystal plane is formed of an r-plane.

According to at least one embodiment, the AT-cut quartz crystal piece has a short side in the Y' axis direction and a thickness in a Z' axis direction.

According to at least one embodiment, first and second masks are formed on one surface and the other surface of the AT-cut quartz crystal piece in a Z' axis direction to have a position deviation of ΔM therebetween in the Y' axis direction, and the AT-cut quartz crystal piece is etched with respect to the first and second masks, such that the first crystal plane is formed.

According to at least one embodiment, a protrusion part is formed on both surfaces of the AT-cut quartz crystal piece in a Z' axis direction, and the electrode layer is formed on each of the protrusion parts.

According to at least one embodiment of the invention, there is provided a manufacturing method of a quartz crystal vibrator, which includes the steps of preparing an AT-cut quartz crystal piece having a long side in an X axis direction, positioning first and second masks on both surfaces of the AT-cut quartz crystal piece in a Z' axis direction to be spaced apart from each other in a Y' axis direction, and etching at least one side surface of the AT-cut quartz crystal piece in the Y' axis direction with respect to the first and second masks to form first and second crystal planes.

According to at least one embodiment, the manufacturing method further includes the steps of etching at least one side surface of the AT-cut quartz crystal piece in the Y' axis direction with respect to the first and second masks, and forming a third mask for forming a bevel on both surfaces of the AT-cut quartz crystal piece in the Z' axis direction, etching the AT-cut quartz crystal piece with respect to the third mask to form a protrusion part, and forming an electrode layer on the protrusion part.

According to at least one embodiment of the invention, there is provided a manufacturing method of a quartz crystal vibrator, which includes the steps of preparing an AT-cut quartz crystal piece having a long side in an X axis direction, positioning first and second masks on both surfaces of the AT-cut quartz crystal piece in a Z' axis direction to be spaced apart from each other in a Y' axis direction, and etching at least one side surface of the AT-cut quartz crystal piece in the Y' axis direction with respect to the first and second masks to form a first crystal plane.

According to at least one embodiment, the manufacturing method further includes the steps of etching at least one side surface of the AT-cut quartz crystal piece in the Y' axis direction with respect to the first and second masks to form an unetched protrusion part, forming a third mask for forming a bevel on both surfaces of the AT-cut quartz crystal piece in the Z' axis direction, and etching the AT-cut quartz crystal piece with respect to the third mask. According to at least one embodiment, the unetched protrusion part is removed in the etching of the AT-cut quartz crystal piece with respect to the third mask, such that the first crystal plane is formed, and a protrusion part is formed in the Z' axis direction.

According to at least one embodiment, the manufacturing method further includes the steps of forming an electrode layer on the protrusion part.

Various objects, advantages and features of the invention will become apparent from the following description of embodiments with reference to the accompanying drawings.

BRIEF DESCRIPTION OF DRAWINGS

These and other features, aspects, and advantages of the invention are better understood with regard to the following Detailed Description, appended Claims, and accompanying Figures. It is to be noted, however, that the Figures illustrate only various embodiments of the invention and are therefore not to be considered limiting of the invention's scope as it may include other effective embodiments as well.

DETAILED DESCRIPTION

Figure 1:
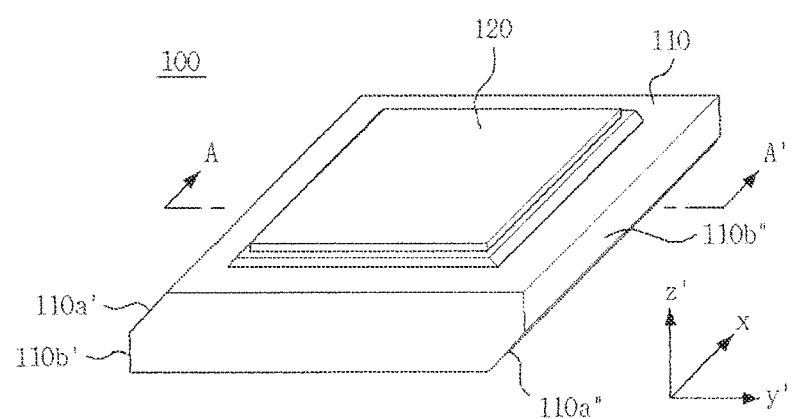
FIG. 1 is a perspective view schematically showing a quartz crystal vibrator according to at least a first embodiment of the invention.

Advantages and features of the present invention and methods of accomplishing the same will be apparent by referring to embodiments described below in detail in connection with the accompanying drawings. However, the present invention is not limited to the embodiments disclosed below and may be implemented in various different forms. The embodiments are provided only for completing the disclosure of the present invention and for fully representing the scope of the present invention to those skilled in the art.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. Like reference numerals refer to like elements throughout the specification.

Figure 2:
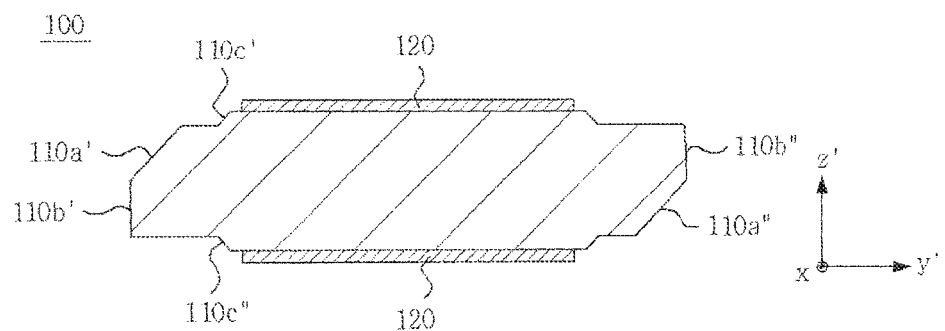
FIG. 2 is a schematic cross-sectional view of the quartz crystal vibrator taken along line A-A' of FIG. 1 according to at least the first embodiment of the invention.

FIG. 1 is a perspective view schematically showing a quartz crystal vibrator according to at least a first embodiment of the invention; and FIG. 2 is a schematic cross-sectional view of the quartz crystal vibrator taken along line A-A' of FIG. 1 according to at least the first embodiment of the invention.

As shown in FIGS. 1 and 2, the quartz crystal vibrator 100 includes an AT-cut quartz crystal piece 110 and an electrode layer 120 formed on the quartz crystal piece. In addition, the AT-cut quartz crystal piece 110 has a long side in an X axis direction, a short side in a Y' axis direction, and a thickness in a Z' axis direction. Thus, the AT-cut quartz crystal piece 110, according to at least one embodiment, has a rectangular parallelepiped shape having a plane composed of X and Y' axes and the thickness in the Z' axis direction extended in a direction orthogonal to the X and Y' axes.

According to at least one embodiment, first and second crystal planes are formed on at least one side surfaces of the AT-cut quartz crystal piece 110 in the Y' axis direction, and the case in which first crystal planes 110a' and 110a" and second crystal planes 110b' and 110b" are formed on both side surfaces of the AT-cut quartz crystal piece 110, respectively, is shown in FIGS. 1 and 2 by way of example.

According to at least one embodiment, the first crystal plane 110a' formed at one side of the AT-cut quartz crystal piece 110 and the first crystal plane 110a" formed at the other side thereof may be formed to be point-symmetric to each other based on a central portion of the AT-cut quartz crystal piece 110, and the second crystal planes 110b' and 110b" is also formed to be point-symmetric to each other based on a central portion of the AT-cut quartz crystal piece 110.

According to at least one embodiment, the first crystal planes 110a' and 110a" is formed of an inclined surface corresponding to an m-plane, and the second crystal planes 110b' and 110b" is formed of an r-plane. According to at least one embodiment, the m- and r-planes are inherent crystal planes of the AT-cut quartz crystal piece, which is apparent to those skilled in the art.

According to at least one embodiment, protrusion parts 110c' and 110c" are formed at both side surfaces of the AT-cut quartz crystal piece 110 in the Z' axis direction, thus, upper and lower surfaces composed of the X and Y' axes, respectively, and the electrodes 120 are formed on the protrusion parts 110c' and 110c", respectively, such that bevels are formed.

Through the above-mentioned configuration, in the quartz crystal vibrator 100 according to at least the first embodiment of the invention, since an irregular multi-surface is not formed at the side surface, which is a main factor in vibration performance, a chip is accurately designed, such that productivity is improved, and the quartz crystal vibrator increases an energy trap effect due to a stable structure and have a low equivalent serial resistance (ESR) and a stable natural frequency.

Figure 3:
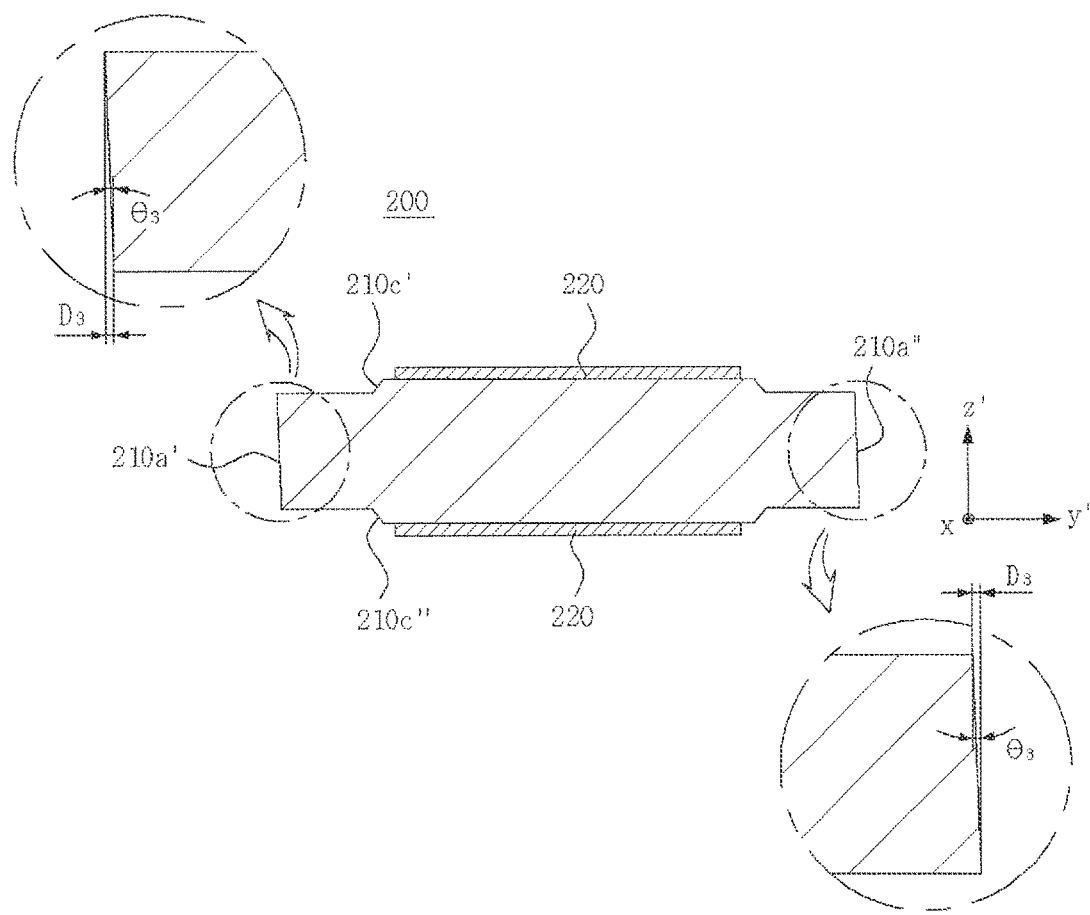
FIG. 3 is a cross-sectional view schematically showing a quartz crystal vibrator according to at least a second embodiment of the invention.

FIG. 3 is a cross-sectional view schematically showing a quartz crystal vibrator according to at least a second embodiment of the invention. As shown in FIG. 3, the quartz crystal vibrator 200 also includes an AT-cut quartz crystal piece 210 and an electrode layer 220 formed on the quartz crystal piece. In addition, the AT-cut quartz crystal piece 210 has a long side in an X axis direction, a short side in a Y' axis direction, and a thickness in a Z' axis direction. Thus, the AT-cut quartz crystal piece 210, according to at least the second embodiment, has a rectangular parallelepiped shape having a plane composed of X and Y' axes and the thickness in the Z' axis direction extended in a direction orthogonal to the X and Y' axes.

In addition, unlike the AT-cut quartz crystal piece 110 of the quartz crystal vibrator 100 according to at least the first embodiment of the invention, the AT-cut quartz crystal piece 210 of the quartz crystal vibrator 200 according to at least the second embodiment of the invention, only a first crystal plane is formed on at least one side surface in the Y' axis direction, and the case in which the first crystal planes 210a' and 210a" are formed at both side surfaces of the AT-cut quartz crystal piece 210 is shown in FIG. 3 by way of example. In addition, the first crystal plane 210a' formed at one side of the AT-cut quartz crystal piece 210 and the first crystal plane 210a" formed at the other side thereof are formed to be point-symmetric to each other based on a central portion of the quartz crystal vibrator 200.

According to at least one embodiment, as shown in an enlarged view of FIG. 3, the first crystal planes 210a' and 210a" are formed of r-planes inclined at an angle of $\theta_3$ and having a spaced distance $D_3$ with respect to the Z' axis direction, respectively.

According to at least one embodiment, protrusion parts 210c' and 210c" are formed at upper and lower surfaces of the AT-cut quartz crystal piece 210 composed of the X and Y' axes, respectively, and the electrodes 220 are formed on the protrusion parts 210c' and 210c", respectively, such that bevels are formed.

Through the above-mentioned configuration, in the quartz crystal vibrator 200 according to at least the second embodiment of the invention, since an irregular multi-surface is also not formed at the side surface, which is a main factor in vibration performance, a chip is accurately designed, such that productivity is improved, and the quartz crystal vibrator increases an energy trap effect due to a stable structure and has a low equivalent serial resistance (ESR) and a stable natural frequency.

Hereinafter, manufacturing processes of the quartz crystal vibrator 100 according to at least the first embodiment of the invention, and the quartz crystal vibrator 200 according to at least the second embodiment of the invention will be described in detail with reference to FIGS. 4 to 8H.

Figure 4:
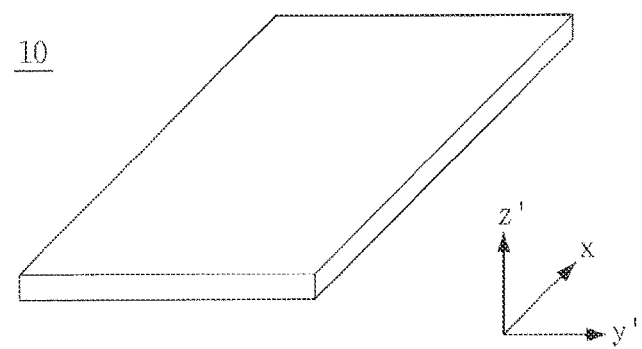
FIG. 4 is a perspective view schematically showing an AT-cut quartz crystal piece, which is a base material of the quartz crystal vibrators, according to at least the first and the second embodiments of the invention, before processing.

FIG. 4 is a perspective view schematically showing an AT-cut quartz crystal piece, which is a base material of the quartz crystal vibrators, according to at least the first and second embodiments of the invention, before processing. As shown in FIG. 4, the AT-cut quartz crystal piece 10 has a long side in an X axis direction, a short side in a Y' axis direction, and a thickness in a Z' axis direction. In addition, an individual AT-cut quartz crystal piece with a desired design value is obtained by etching both sides of the AT-cut quartz crystal piece 10 in a Y' axis direction.

As an etching process for obtaining the individual AT-cut quartz crystal piece, FIGS. 5A to 5E are views showing a first example of a manufacturing process for manufacturing the quartz crystal vibrator according to at least the first embodiment of the invention.

Figure 5A:
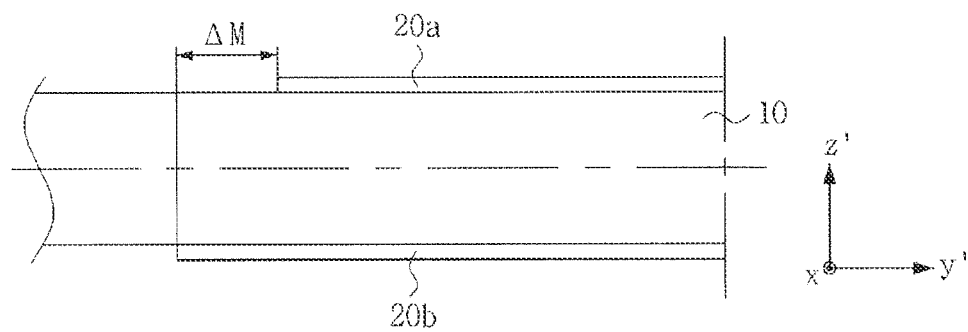
FIGS. 5A to 5E are views showing a first example of a manufacturing process for manufacturing the quartz crystal vibrator according to at least the first embodiment of the invention.
Figure 5B:
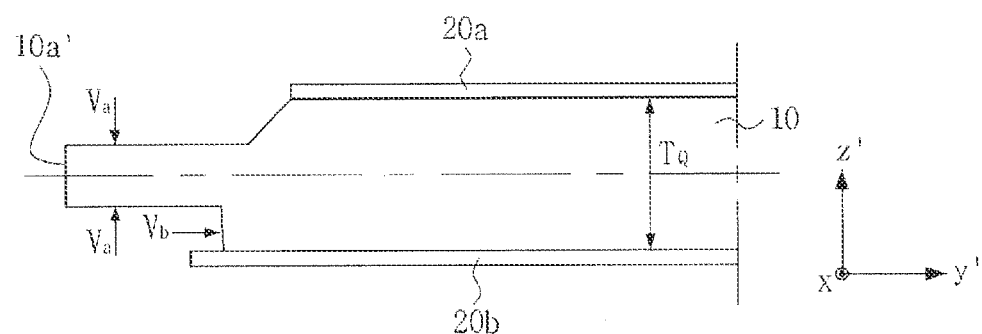

First, as shown in FIG. 5A, first and second masks 20a and 20b are formed at upper and lower surfaces of the AT-cut quartz crystal piece 10 in the Z' axis direction to have a position deviation of $\Delta M$ therebetween in the Y' axis direction, respectively. In addition, as shown in FIG. 5B, the side surface of the AT-cut quartz crystal piece 10 is etched with respect to the first and second masks 20a and 20b. In this case, an etching solution used in the etching process is, for example, an ammonium fluoride solution.

According to at least one embodiment, as shown in 5B, the side surface of the AT-cut quartz crystal piece 10 is formed with a remainder 10a', and the remainder 10a' is removed at the time of performing a subsequent etching process for forming a bevel, thereby making it possible to decrease a process time.

Figure 5C:
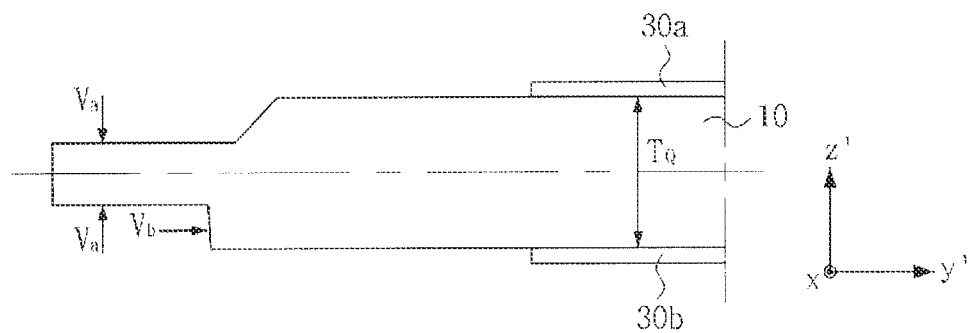

Next, as shown in FIG. 5C, the first and second masks 20a and 20b are removed from the AT-cut quartz crystal piece 10, respectively, and third and fourth masks 30a and 30b are formed on predetermined regions of the upper and lower surfaces of the AT-cut quartz crystal piece 10 in order to form protrusion parts for forming the bevels, respectively.

Figure 5D:
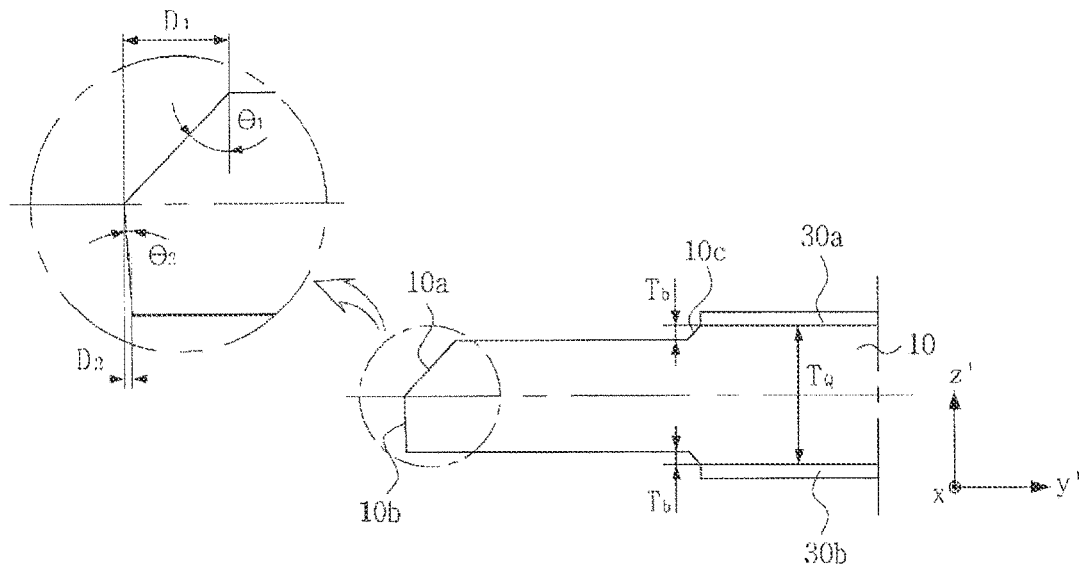

According to at least one embodiment, the AT-cut quartz crystal piece 10 is etched with respect to the third and fourth masks 30a and 30b, such that the remainder 10a' is removed, a protrusion part 10c is formed at the AT-cut quartz crystal piece 10, and first and second crystal planes 10a and 10b are formed on one side surface of the AT-cut quartz crystal piece 10 as shown in FIG. 5D.

According to at least one embodiment, the remainder 10a' has a thickness of a half of a thickness of the AT-cut quartz crystal piece 10, and the double of $\Delta M$, which is the position deviation between the first and second masks 20a and 20b, thus, $2\Delta M$ is set as a minimum interval between chips, such that the number of individual AT-cut quartz crystal pieces are increased.

Figure 5E:
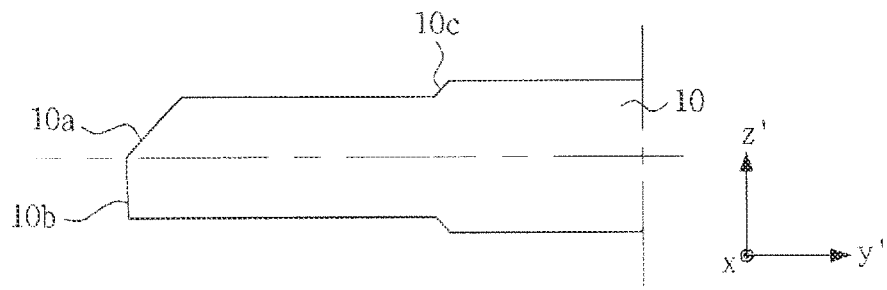

According to at least one embodiment, as shown in FIG. 5E, the third and fourth masks 30a and 30b are removed. Next, an electrode is applied onto the protrusion part 10c later, thereby completing the quartz crystal vibrator according to at least the first embodiment of the invention shown in FIGS. 1 and 2.

Hereinafter, the setting of $\Delta M$, which is a spaced distance between the first and second masks 20a and 20b, will be described in detail.

For setting $\Delta M$, when $V_a$ is defined as an etching rate of the AT-cut quartz crystal piece in a vertical direction (Z' axis direction), $V_b$ is defined as an etching rate of the AT-cut quartz crystal piece in a horizontal direction (Y' direction), $T_Q$ is defined as a thickness of the AT-cut quartz crystal piece in the vertical direction (Z' axis direction), $T_b$ is defined as a thickness of the bevel in the vertical direction (Z' axis direction), $\theta_1$ is defined as an angle between an AT-cut reference plane of the AT-cut quartz crystal piece and the etched first crystal plane of the AT-cut quartz crystal piece, and $\theta_2$ is defined as an angle between the AT-cut reference plane of the AT-cut quartz crystal piece and the etched second crystal plane of the AT-cut quartz crystal piece, an etching time of the side surface of the AT-cut quartz crystal piece is $(T_Q-2T_b)/2V_a$ and an etching time of the bevel is $T_b/V_a$.

According to at least one embodiment, $\Delta M$, which is a spaced distance between the first and second masks 20a and 20b, is calculated as a horizontal distance of the first crystal plane etched at a rate of $V_b$ while the side surface of the AT-cut quartz crystal piece is penetrated +D$_1$ (shown in FIG. 5I))–D$_2$ (shown in FIG. 5D).

Thus, $\Delta M$, which is a spaced distance between the first and second masks 20a and 20b, is defined as follows:

$$\Delta M = \frac{V_b(T_Q - 2T_b)}{2V_a} + \tan\theta_1 \times \left(\frac{T_Q - 2T_b}{2}\right) - \tan\theta_2 \times \left(\frac{T_Q - 2T_b}{2}\right)$$

Meanwhile, since an inclined angle with respect to the Z' axis of the AT-cut is 35°15', $\theta_1$ may be 54°45' by subtracting 35°15' from 90°, and since a theoretical angle between first and second inclined surfaces is 141° 48', $\theta_2$ may be 2°57' by subtracting 141° 48' and 35°15' from 180°.

According to at least one embodiment, a margin of $\Delta M$, which is a spaced distance between the first and second masks 20a and 20b, is set to about 20%.

FIGS. 6A to 6F are views showing a second example of the manufacturing process for manufacturing the quartz crystal vibrator according to at least the first embodiment of the invention. As shown in FIGS. 6A to 6F, the second example of the manufacturing process is different from the first example shown in FIGS. 5A to 5E in that after a protrusion part for a bevel is formed, a side surface of an AT-cut quartz crystal piece is etched.

Figure 6A:
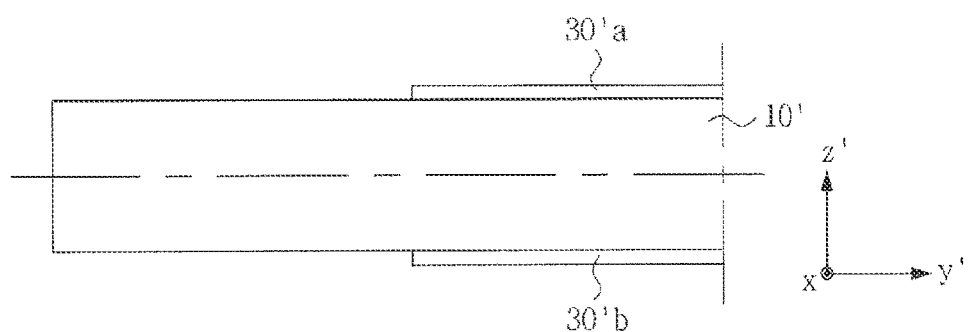
FIGS. 6A to 6F are views showing a second example of the manufacturing process for manufacturing the quartz crystal vibrator according to at least the first embodiment of the invention.

More specifically, FIG. 6A shows that third and fourth masks 30'a and 30'b are formed on upper and lower surfaces of the AT-cut quartz crystal piece 10' in a Z' axis direction, respectively. In addition, the third and fourth masks 30'a and 30'b are to form the protrusion part for the bevel on the AT-cut quartz crystal piece 10'.

Figure 6B:
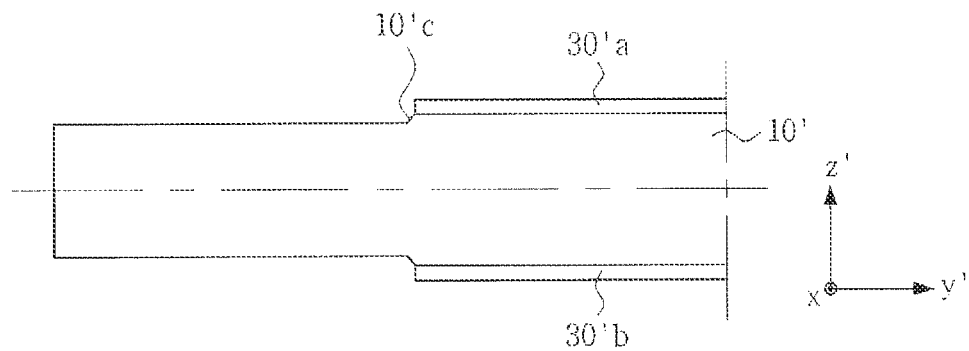

Further, in the case of etching the AT-cut quartz crystal piece 10' with respect to the third and fourth masks 30'a and 30'b, as shown in FIG. 6B, a protrusion part 10'c is formed at the AT-cut quartz crystal piece 10'.

Figure 6C:
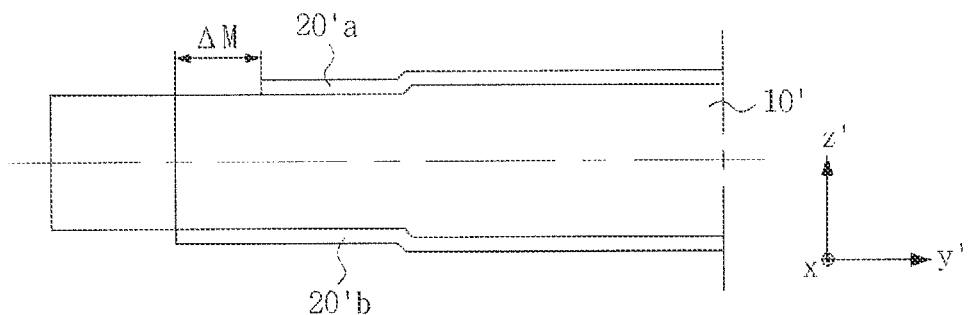

Next, as shown in FIG. 6C, the third and fourth masks 30'a and 30'b are removed, and first and second masks 20'a and 20'b are formed, respectively, to be spaced part from each other by $\Delta M$ in a Y' axis direction.

Figure 6D:
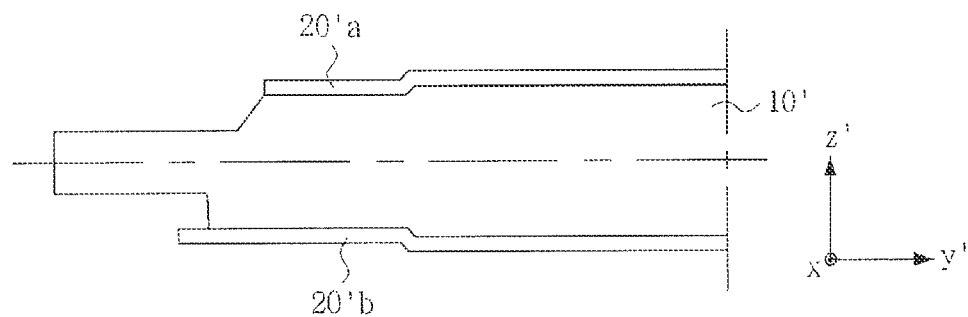
Figure 6E:
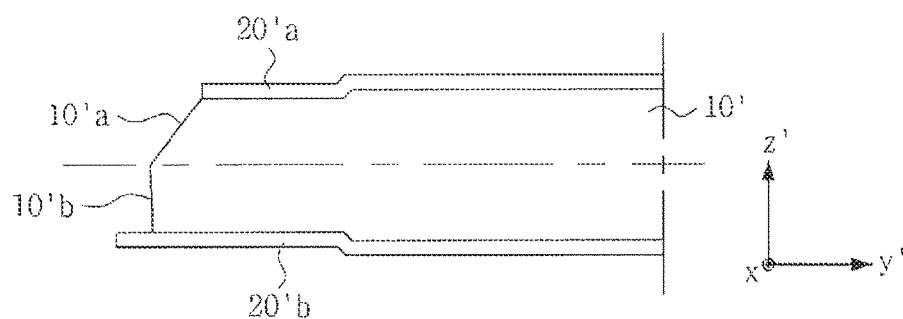

Then, as shown in FIGS. 6D and 6E, side surfaces of the AT-cut quartz crystal piece 10' are sequentially etched, and the side surfaces of the AT-cut quartz crystal piece 10' are formed of first and second crystal planes 10'a and 10'b.

Figure 6F:
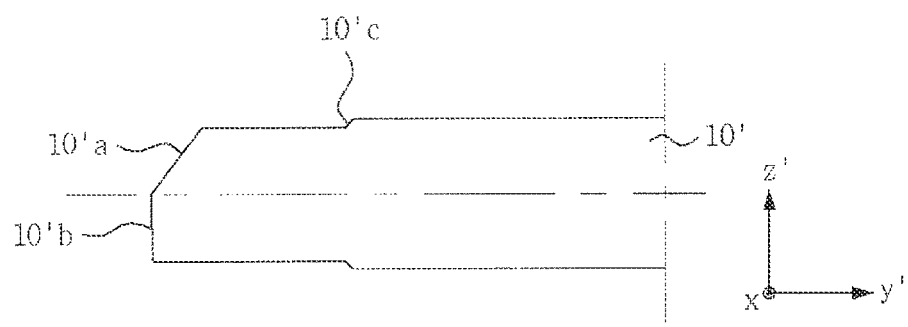

Then, as shown in FIG. 6F, the first and second masks 20'a and 20'b are removed. Next, an electrode is applied onto the protrusion part 10'c later, thereby completing the quartz crystal vibrator according to at least the first embodiment of the invention shown in FIGS. 1 and 2.

In addition, the setting of $\Delta M$, which is a spaced distance between the first and second masks 20'a and 20'b, is the same as that in the above mentioned arithmetic expression of $\Delta M$ in the first example of the manufacturing process.

FIGS. 7A to 7G are views showing a first example of a manufacturing process for manufacturing the quartz crystal vibrator according to at least the second embodiment of the invention.

Figure 7A:
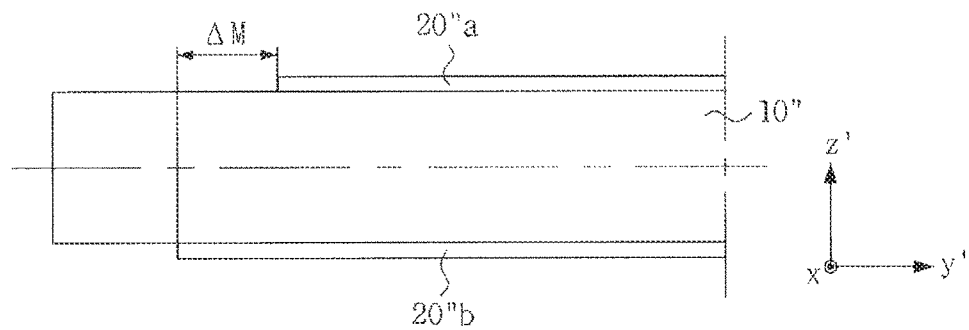
FIGS. 7A to 7G are views showing a first example of a manufacturing process for manufacturing the quartz crystal vibrator according to at least the second embodiment of the invention.
Figure 7B:
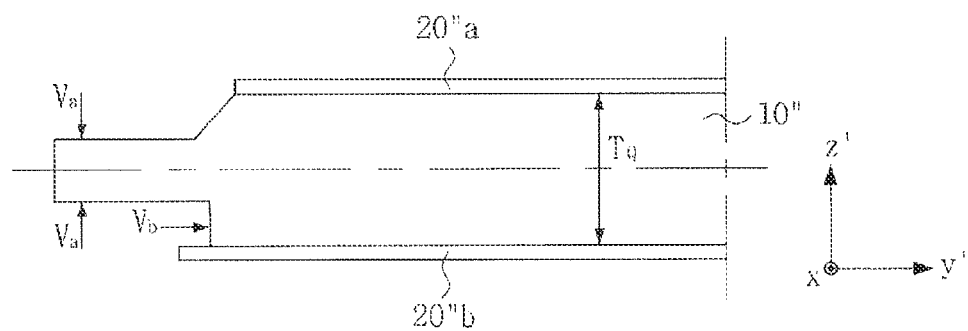
Figure 7C:
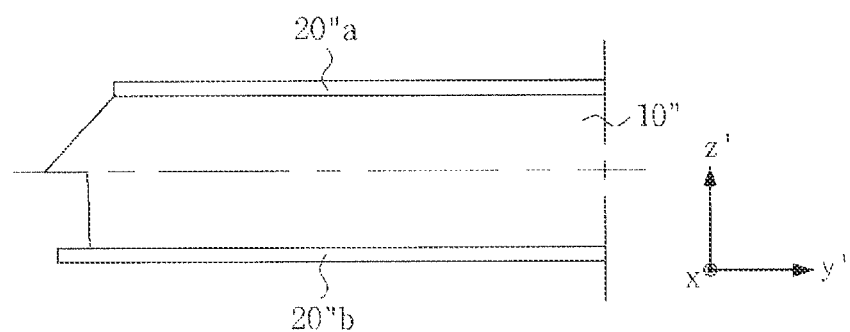
Figure 7D:
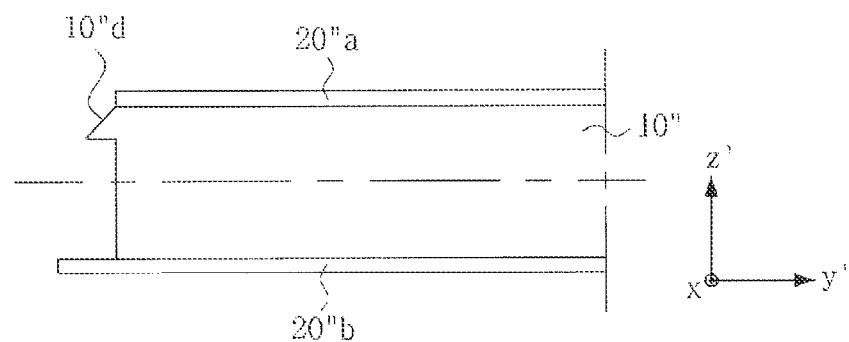

More specifically, as shown in FIG. 7A, first and second masks 20"a and 20"b are formed at upper and lower surfaces of an AT-cut quartz crystal piece 10" in a Z' axis direction, respectively, to be spaced apart from each other by $\Delta M$ in a Y' axis direction. Further, in the case of etching the AT-cut quartz crystal piece 10" using an etching solution such as an ammonium fluoride solution, for example, until an unetched protrusion part is minimized, the AT-cut quartz crystal piece 10" is sequentially etched as shown in FIGS. 7B to 7D. In addition, as shown in FIG. 7D, an unetched protrusion part 10"d remains at the side surface of the AT-cut quartz crystal piece 10".

Figure 7E:
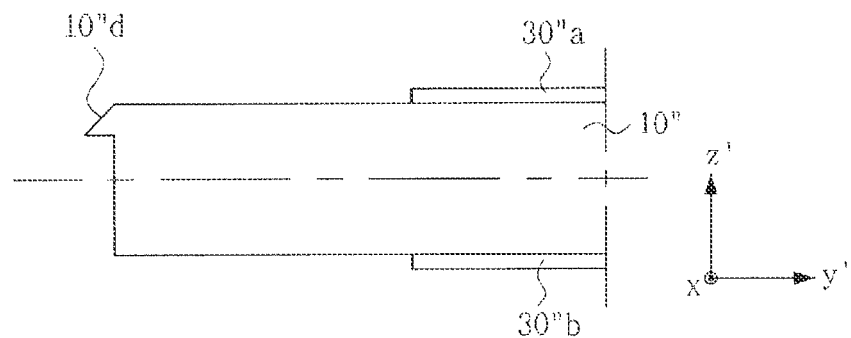

Next, as shown in FIG. 7E, the first and second masks 20"a and 20"b are removed, and third and fourth masks 30"a and 30"b are formed on the upper and lower surfaces of the AT-cut quartz crystal piece 10" in order to form protrusion parts for forming the bevels, respectively.

Figure 7F:
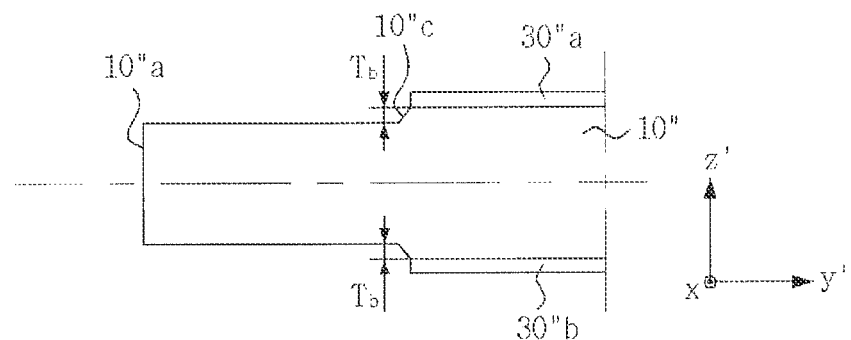

According to at least one embodiment, in the case of etching the AT-cut quartz crystal piece 10" with respect to the third and fourth masks 30"a and 30"b, as shown in FIG. 7F, a protrusion part 10"c having a step is formed and at the same time, the unetched protrusion part 10"d at the side surface is etched, such that a crystal plane 10"a is formed at the side surface of the AT-cut quartz crystal piece 10".

Figure 7G:
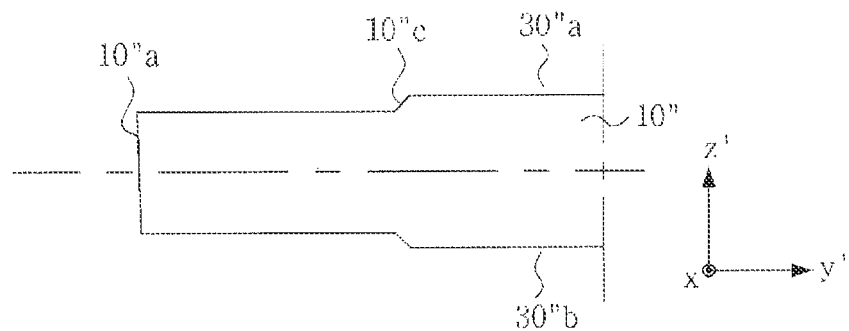

Then, as shown in FIG. 7G, the third and fourth masks 30"a and 30"b are removed.

Next, an electrode is applied onto the protrusion part 10"c later, thereby completing the quartz crystal vibrator according to at least the second embodiment of the invention shown in FIG. 3.

FIGS. 8A to 8H are views showing a second example of the manufacturing process for manufacturing the quartz crystal vibrator according to at least the second embodiment of the invention. As shown in FIGS. 8A to 8H, the second example of the manufacturing process is different from the first example thereof shown in FIGS. 7A to 7G in that after a protrusion part for a bevel is formed, a side surface of an AT-cut quartz crystal piece is etched.

Figure 8A:
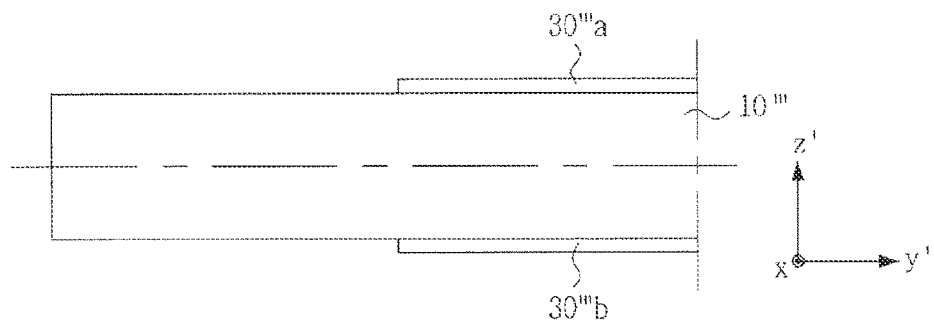
FIGS. 8A to 8H are views showing a second example of the manufacturing process for manufacturing the quartz crystal vibrator according to at least the second embodiment of the invention.

According to at least one embodiment, FIG. 8A shows that third and fourth masks 30'''a and 30'''b for forming the protrusion part for the bevel are formed on upper and lower surfaces of the AT-cut quartz crystal piece 10''' in the Z' axis direction, respectively.

Figure 8B:
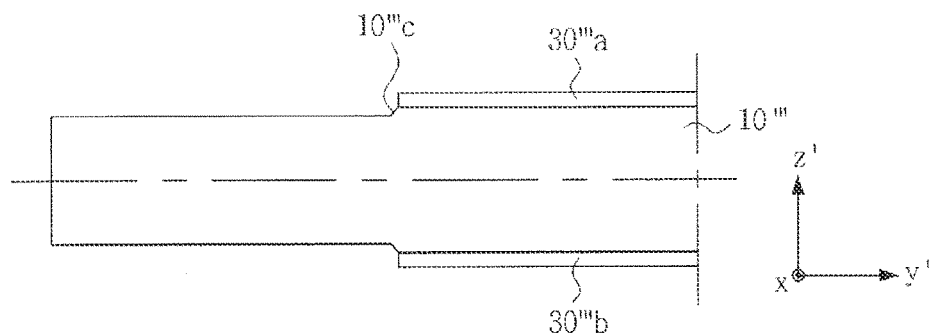

According to at least one embodiment, in the case of etching the AT-cut quartz crystal piece 10''' with respect to the third and fourth masks 30'''a and 30'''b, as shown in FIG. 8B, a protrusion part 10'''c having a step is formed at the AT-cut quartz crystal piece 10'''.

Figure 8C:
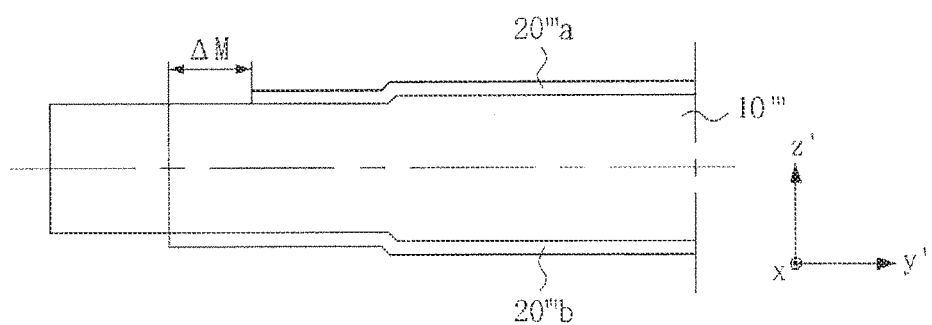
Figure 8D:
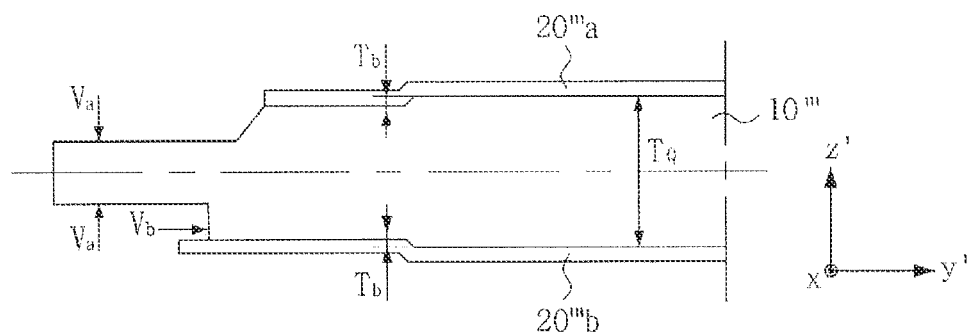
Figure 8E:
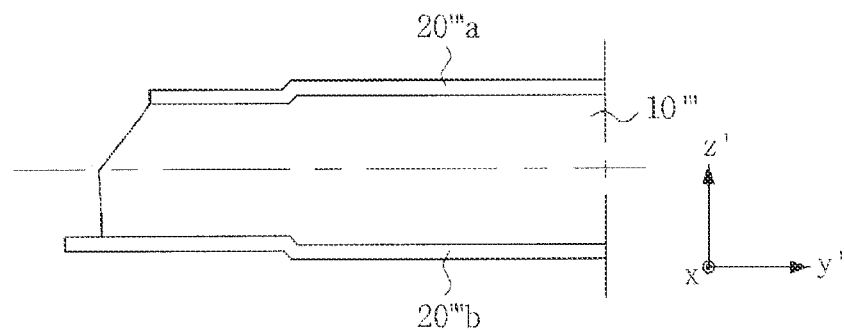

Next, as shown in FIG. 8C, the third and fourth masks 30'''a and 30'''b are removed, and first and second masks 20'''a and 20'''b are formed on the AT-cut quartz crystal piece 10''' to be spaced apart from each other by $\Delta M$ in a Y' axis direction, respectively. Further, in the case of etching the side surface of the AT-cut quartz crystal piece 10''' with respect to the first and second masks 20'''a and 20'''b, the side surface of the AT-cut quartz crystal piece 10''' is sequentially etched as shown in FIGS. 8D to 8F.

Figure 8F:
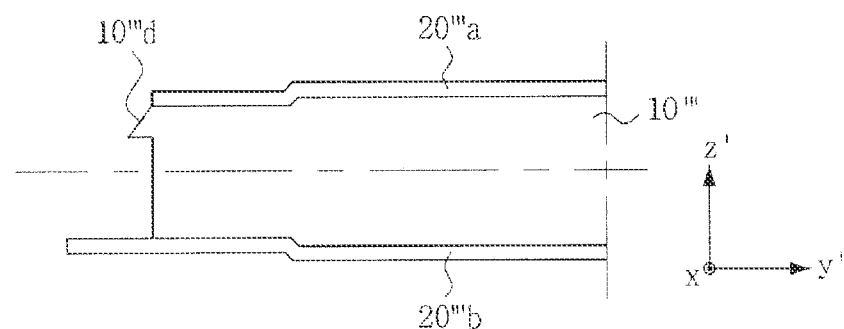

According to at least one embodiment, as shown in FIG. 8F, an unetched protrusion part 10'''*d* remains at the side surface of the AT-cut quartz crystal piece 10'''.

Figure 8G:
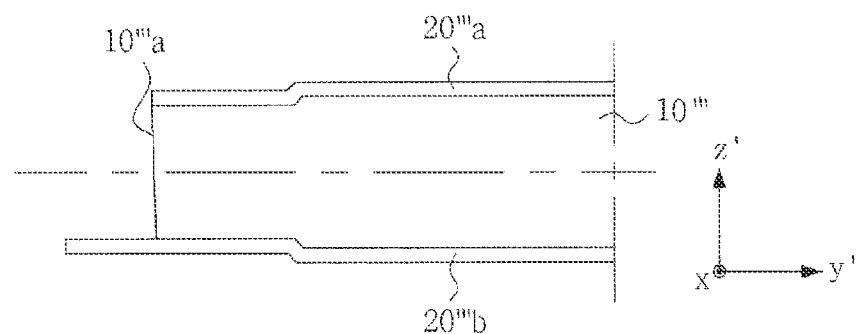

Next, as shown in FIG. 8G, the unetched protrusion part 10'''*d* is etched, such that a crystal plane 10'''*a* is formed at the side surface of the AT-cut quartz crystal piece 10'''.

Figure 8H:
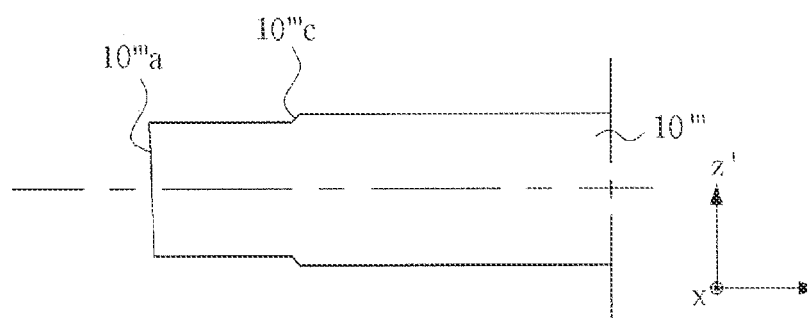

According to at least one embodiment, as shown in FIG. 8H, the first and second masks 20'''*a* and 20'''*b* are removed. Next, an electrode is applied onto the protrusion part 10'''*c* later, thereby completing the quartz crystal vibrator according to at least the second embodiment of the invention shown in FIG. 3.

Further, for setting ΔM, which is spaced distance between the first mask 20"*a* or 20'''*a* and the second mask 20"*b* or 20'''*b*, in order to implement the first and second examples of the manufacturing processes for manufacturing the quartz crystal vibrator according to the second embodiment of the invention, when $V_a$ is defined as an etching rate of the AT-cut quartz crystal piece in a vertical direction (Z' axis direction), $V_b$ is defined as an etching rate of the AT-cut quartz crystal piece in a horizontal direction (Y' axis direction), $T_Q$ is defined as a thickness of the AT-cut quartz crystal piece in the vertical direction (Z' axis direction), and $T_b$ is defined as a thickness of the bevel in the vertical direction (Z' axis direction), an etching time of the side surface of the AT-cut quartz crystal piece is $(T_Q-2T_b)/V_a$ and an etching time of the bevel is $T_b/V_a$.

According to at least one embodiment, ΔM, which is spaced distance between the first mask and the second mask is $V_b(T_Q-2T_b)/V_a$.

Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Embodiments of the present invention may suitably comprise, consist or consist essentially of the elements disclosed and may be practiced in the absence of an element not disclosed. For example, it can be recognized by those skilled in the art that certain steps can be combined into a single step.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The singular forms "a," "an," and "the" include plural referents, unless the context clearly dictates otherwise.

As used herein and in the appended claims, the words "comprise," "has," and "include" and all grammatical variations thereof are each intended to have an open, non-limiting meaning that does not exclude additional elements or steps.

As used herein, the terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "according to an embodiment" herein do not necessarily all refer to the same embodiment.

Ranges may be expressed herein as from about one particular value, and/or to about another particular value. When such a range is expressed, it is to be understood that another embodiment is from the one particular value and/or to the other particular value, along with all combinations within said range.

Although the present invention has been described in detail, it should be understood that various changes, substitutions, and alterations can be made hereupon without departing from the principle and scope of the invention. Accordingly, the scope of the present invention should be determined by the following claims and their appropriate legal equivalents.

What is claimed is:

1. A quartz crystal vibrator, comprising:
    an AT-cut quartz crystal piece having a long side in an X axis direction and comprising first and second crystal planes formed on at least one side surface thereof in a Y' axis direction; and
    an electrode layer formed on the AT-cut quartz crystal piece.

2. The quartz crystal vibrator of claim 1, wherein the first and second crystal planes are formed on one side surface and the other side surface of the AT-cut quartz crystal piece in the Y' axis direction, respectively.

3. The quartz crystal vibrator of claim 1, wherein the first crystal plane of the AT-cut quartz crystal piece is formed of an inclined surface.

4. The quartz crystal vibrator of claim 3, wherein the first crystal plane is formed of an m-plane.

5. The quartz crystal vibrator of claim 1, wherein the second crystal plane of the AT-cut quartz crystal piece is formed of an r-plane.

6. The quartz crystal vibrator of claim 1, wherein the AT-cut quartz crystal piece has a short side in the Y' axis direction and a thickness in a Z' axis direction.

7. The quartz crystal vibrator of claim 1, wherein first and second masks are formed on one surface and the other surface of the AT-cut quartz crystal piece in a Z' axis direction, respectively, to have a position deviation of ΔM therebetween in the Y' axis direction, and the AT-cut quartz crystal piece is etched with respect to the first and second masks, such that the first and second crystal planes are formed on at least one side surface of the AT-cut quartz crystal piece in the Y' axis direction.

8. The quartz crystal vibrator of claim 1, wherein a protrusion part is formed on both surfaces of the AT-cut quartz crystal piece in a Z' axis direction, and the electrode layer is formed on each of the protrusion parts.

9. A quartz crystal vibrator, comprising:
an AT-cut quartz crystal piece having a long side in an X axis direction and comprising a first crystal plane formed on at least one side surface thereof in a Y' axis direction; and
an electrode layer formed on the AT-cut quartz crystal piece.

10. The quartz crystal vibrator of claim 9, wherein the first crystal plane is formed of an r-plane.

11. The quartz crystal vibrator of claim 9, wherein the AT-cut quartz crystal piece has a short side in the Y' axis direction and a thickness in a Z' axis direction.

12. The quartz crystal vibrator of claim 9, wherein first and second masks are formed on one surface and the other surface of the AT-cut quartz crystal piece in a Z' axis direction to have a position deviation of $\Delta M$ therebetween in the Y' axis direction, and the AT-cut quartz crystal piece is etched with respect to the first and second masks, such that the first crystal plane is formed.

13. The quartz crystal vibrator of claim 9, wherein a protrusion part is formed on both surfaces of the AT-cut quartz crystal piece in a Z' axis direction, and the electrode layer is formed on each of the protrusion parts.

* * * * *